US007812418B2

(12) United States Patent
Hsu et al.

(10) Patent No.: US 7,812,418 B2
(45) Date of Patent: Oct. 12, 2010

(54) CHIP-SCALED MEMS MICROPHONE PACKAGE

(75) Inventors: Wei-Chan Hsu, Cupertino, CA (US); Li-Te Wu, Taipei (TW)

(73) Assignee: Fortemedia, Inc, Cupertino, CA (US)

(*) Notice: Subject to any disclaimer, the term of this patent is extended or adjusted under 35 U.S.C. 154(b) by 36 days.

(21) Appl. No.: 12/181,440

(22) Filed: Jul. 29, 2008

(65) Prior Publication Data

US 2010/0027830 A1 Feb. 4, 2010

(51) Int. Cl.
*H01L 27/14* (2006.01)
*H01L 29/84* (2006.01)
*H01L 29/82* (2006.01)
*H04R 25/00* (2006.01)

(52) U.S. Cl. ....................... 257/419; 257/415; 257/414; 257/416; 381/174

(58) Field of Classification Search ......... 257/414–416, 257/419; 381/174
See application file for complete search history.

(56) References Cited

U.S. PATENT DOCUMENTS 5,490,220 A * 2/1996 Loeppert .................... 381/355
5,856,914 A * 1/1999 O'Boyle ..................... 361/761
6,178,249 B1 * 1/2001 Hietanen et al. ............ 381/174
6,870,939 B2 * 3/2005 Chiang et al. ............... 381/175
7,466,834 B2 * 12/2008 Ogura et al. ................ 381/174

* cited by examiner

*Primary Examiner*—Luan C Thai
(74) *Attorney, Agent, or Firm*—Thomas, Kayden, Horstemeyer & Risley

(57) ABSTRACT

An MEMS microphone package includes a circuit board and an MEMS microphone chip. The MEMS microphone chip, mounted on the circuit board, includes a substrate, an MEMS transducer formed on the substrate, and a readout circuit also formed on the substrate. The MEMS transducer generates a sound signal according to sound pressure variations. The readout circuit reads the sound signal from the MEMS transducer.

21 Claims, 4 Drawing Sheets

CHIP-SCALED MEMS MICROPHONE PACKAGE

BACKGROUND OF THE INVENTION

1. Field of the Invention

The invention relates to an MEMS (micro-electro-mechanical-system) microphone package, and more particularly to a chip-scaled MEMS microphone package.

2. Description of the Related Art

Referring to FIG. 1, a conventional MEMS (micro-electro-mechanical-system) microphone package 10 includes a substrate 102, a metal cap 101 attached to the substrate 102, an MEMS microphone die 103 mounted on the substrate 102, and a readout IC (integrated circuit) chip 104 also mounted on the substrate 102.

The metal cap 101 has a sound inlet 106 through which the MEMS microphone die 103 receives external sound. The MEMS microphone die 103 has an MEMS sensor (not shown) inside for converting sound into an electrical signal. A bonding wire 105 is connected between the MEMS microphone die 103 and the readout IC chip 104. The readout IC chip 104 provides bias voltage (around 12V) for the MEMS sensor, receives the electrical signal from the MEMS sensor, and drives external low-impedance loading.

The metal cap 101 and the substrate 102 constitute a means for shielding, to protect the MEMS microphone die 103 from RF (radio frequency) interference.

However, the size of the conventional MEMS microphone package 10 does not meet modern mobile electronic device requirements for extreme compactness. Specifically, the dimensions of the MEMS sensor are around 1 mm×1 mm, so the MEMS microphone package 10 containing the MEMS sensor is somewhat large when provided in a compact mobile phone. Furthermore, the MEMS microphone package 10 has a minimum thickness of about 1.1 mm, and therefore can not be applied in ultra-thin mobile phones.

BRIEF SUMMARY OF THE INVENTION

The invention provides a chip-scaled MEMS microphone package applicable to various compact electronic devices. The microphone package in accordance with an exemplary embodiment of the invention includes a circuit board and a MEMS microphone chip. The MEMS microphone chip, mounted on the circuit board, includes a substrate, an MEMS transducer formed on the substrate, and a readout circuit also formed on the substrate. The MEMS transducer generates a sound signal according to a sound pressure variation. The readout circuit reads the sound signal from the MEMS transducer.

In another exemplary embodiment of the chip-scaled MEMS microphone package, the MEMS transducer includes a flexible diaphragm vibrating according to the sound pressure variations, and a rigid back plate spaced apart from the flexible diaphragm.

In yet another exemplary embodiment of the chip-scaled MEMS microphone package, the back plate of the MEMS transducer is perforated.

In another exemplary embodiment of the chip-scaled MEMS microphone package, the readout circuit is a complementary metal-oxide semiconductor circuit.

In yet another exemplary embodiment of the chip-scaled MEMS microphone package, the MEMS microphone chip further includes a plurality of side walls which encircle the micro-electro-mechanical-system transducer and the readout circuit on the substrate, and separate the circuit board from the substrate.

In another exemplary embodiment of the chip-scaled MEMS microphone package, a back chamber is formed by the side walls, the circuit board, and the substrate, and the circuit board has a through hole connected to the interior of the back chamber.

In yet another exemplary embodiment of the chip-scaled MEMS microphone package, the side walls, the circuit board, and the substrate are electrically connected to a constant voltage so as to form a means for shielding, thus protecting the MEMS transducer from radio frequency interference.

In another exemplary embodiment of the chip-scaled MEMS microphone package t, the substrate has a contact electrically connected to the constant voltage, and the MEMS microphone chip further includes a bumping ball formed on the substrate and electrically connected to the contact as well as the circuit board.

In yet another exemplary embodiment of the chip-scaled MEMS microphone package, the micro-electro-mechanical-system microphone chip further includes a bumping ball formed on the substrate and electrically connected between the readout circuit and the circuit board.

The invention also provides an electronic device, including a circuit board, a system board, and an MEMS microphone chip. The system board is electrically connected to the circuit board. The MEMS microphone chip, mounted on the circuit board, includes a substrate, a MEMS transducer formed on the substrate, and a readout circuit also formed on the substrate. The MEMS transducer generates a sound signal according to sound pressure variations. The readout circuit reads the sound signal from the MEMS transducer.

In another exemplary embodiment of the electronic device, the MEMS transducer includes a flexible diaphragm vibrating according to sound pressure variations, and a rigid back plate spaced apart from the flexible diaphragm.

In yet another exemplary embodiment of the electronic device, the back plate of the MEMS transducer is perforated.

In another exemplary embodiment of the electronic device, the readout circuit is a complementary metal-oxide semiconductor circuit.

In yet another exemplary embodiment of the electronic device, the MEMS microphone chip further includes a plurality of side walls which encircle the micro-electro-mechanical-system transducer and the readout circuit on the substrate, and separate the circuit board from the substrate.

In another exemplary embodiment of the electronic device t, a back chamber is formed by the side walls, the circuit board, and the substrate, and the circuit board has a through hole connected to the interior of the back chamber.

In yet another exemplary embodiment of the electronic device, the side walls, the circuit board, and the substrate are electrically connected to a constant voltage so as to form a means for shielding, thus protecting the micro-electro-mechanical-system transducer from radio frequency interference.

In another exemplary embodiment of the electronic device, the substrate has a contact electrically connected to the constant voltage, and the micro-electro-mechanical-system microphone chip further includes a bumping ball formed on the substrate and electrically connected to the contact as well as the circuit board.

In yet another exemplary embodiment of the electronic device, the MEMS microphone chip further includes a bumping ball formed on the substrate and electrically connected between the readout circuit and the circuit board.

The invention also provides an MEMS microphone chip, including a substrate, a MEMS transducer, and a readout circuit. The MEMS transducer, formed on the substrate, generates a sound signal according to sound pressure variations. The readout circuit, also formed on the substrate, reads the sound signal from the MEMS transducer.

In another exemplary embodiment of the MEMS microphone chip, the MEMS transducer includes a flexible diaphragm vibrating according to sound pressure variations, and a rigid back plate spaced apart from the flexible diaphragm.

In yet another exemplary embodiment of the MEMS microphone chip, the back plate of the MEMS transducer is perforated.

In another exemplary embodiment of the MEMS microphone chip, the readout circuit is a complementary metal-oxide semiconductor circuit.

In yet another exemplary embodiment of the MEMS microphone chip, the MEMS microphone chip further includes a plurality of side walls encircling the MEMS transducer and the readout circuit on the substrate.

In another exemplary embodiment of the MEMS microphone chip, the MEMS microphone chip further includes a bumping ball formed on the substrate and electrically connected to the readout circuit.

In yet another exemplary embodiment of the MEMS microphone chip, the MEMS microphone chip further includes a bumping ball formed on the substrate and electrically connected to a constant voltage through the substrate.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
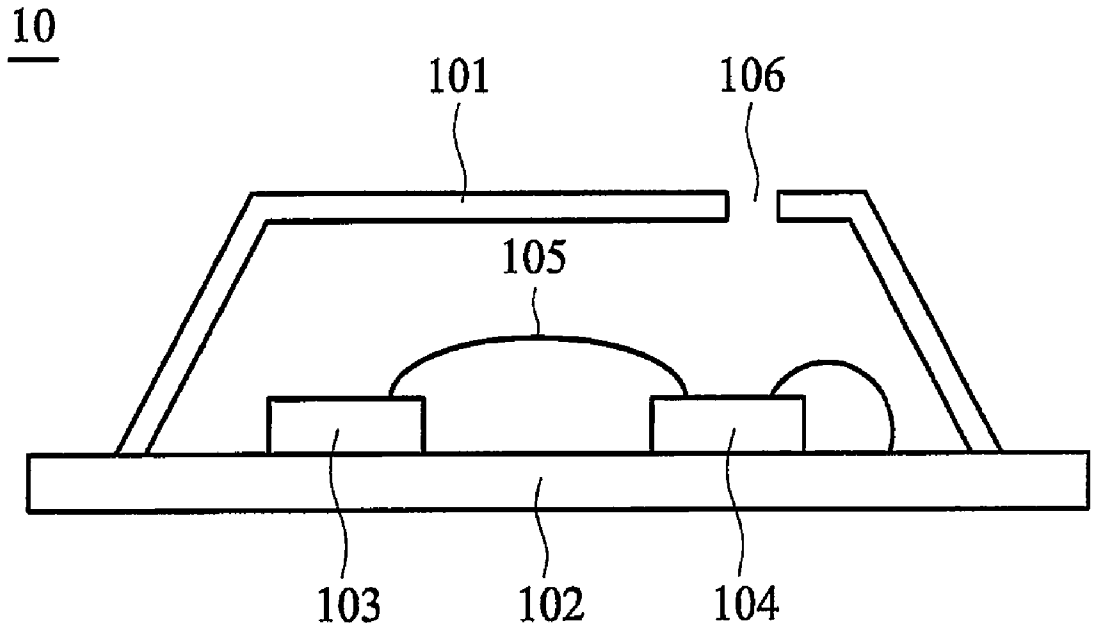
FIG. 1 ( PRIOR ART )
FIG. 1 depicts a schematic diagram of a conventional MEMS (micro-electro-mechanical-system) microphone package.
Figure 2A:
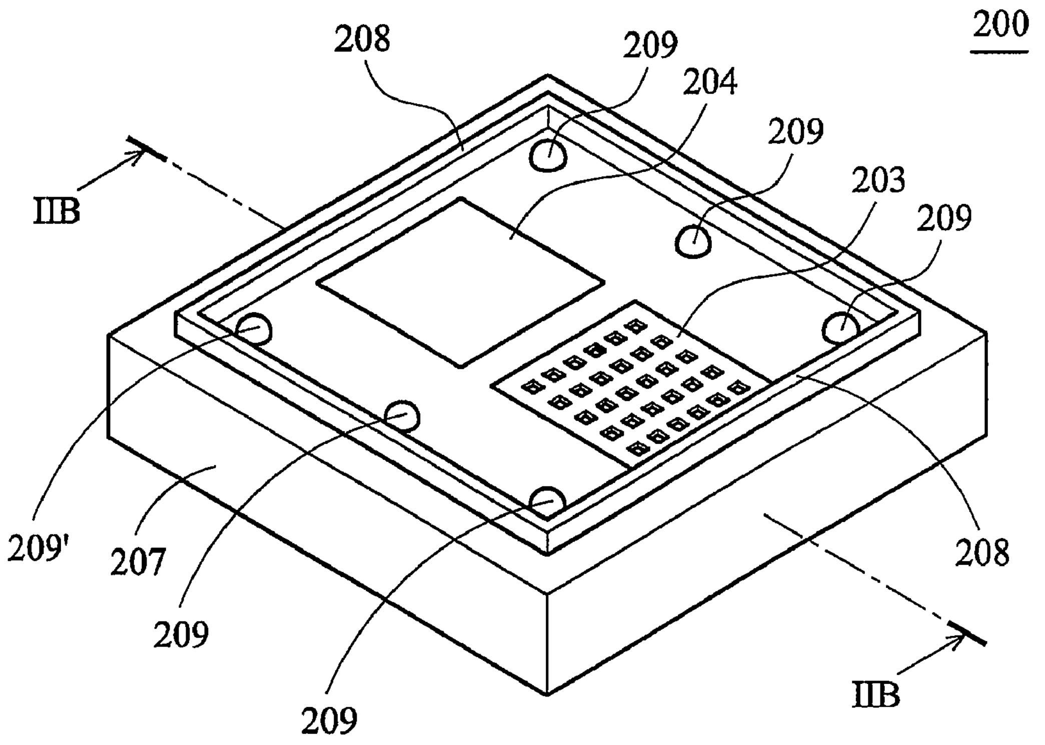
FIG. 2A is a perspective diagram of an MEMS microphone chip in accordance with an embodiment of the invention.
Figure 2B:
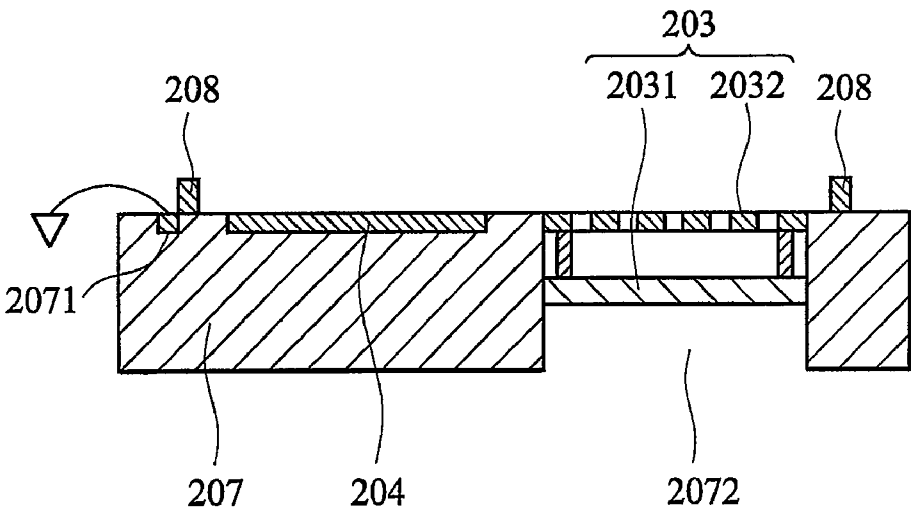
FIG. 2B is a IIB-IIB sectional view of the MEMS microphone chip of FIG. 2A.

Referring to FIG. 2A, in an embodiment of the invention, a micro-electro-mechanical-system (MEMS) microphone chip 200 includes a substrate 207, an MEMS transducer 203 formed on the substrate 207, and a readout circuit 204 also formed on the substrate 207. The substrate 207 is conductive and made of, for example, doped silicon or SOI (silicon on insulator). Referring to FIG. 2B, the substrate 207 has a contact 2071 on the top and a sound inlet 2072 on the bottom, wherein the contact 2071 is electrically connected to the ground, and the sound inlet 2072 allows the MEMS transducer 203 to receive sound. The MEMS transducer 203 has a flexible diaphragm 2031 and a rigid back plate 2032 spaced apart from the flexible diaphragm 2031. The flexible diaphragm 2031 vibrates in accordance with sound pressure variations so that the voltage difference between the diaphragm 2031 and the back plate 2032 varies. The variation of the voltage difference is interpreted as a sound signal. The readout circuit 204 provides a bias voltage for the MEMS transducer 203, receives the sound signal from the MEMS transducer 203, and drives an external loading circuit (not shown). In this embodiment, the readout circuit 204 is a complementary metal-oxide semiconductor (CMOS) circuit.

Referring to FIG. 2A, a plurality of bumping balls 209 and 209' is formed on the substrate 207. One bumping ball 209' is electrically connected to the grounded contact 2071. The other bumping balls 209 connect the readout circuit 204 to the external loading circuit.

A plurality of side walls 208 is provided on the substrate 207 to encircle the MEMS transducer 203, the readout circuit 204, and the bumping balls 209 and 209'.

Figure 3:
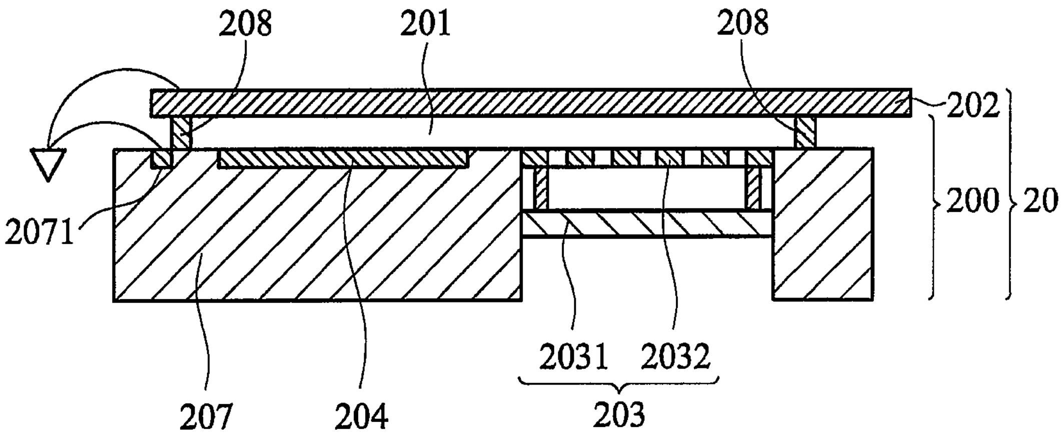
FIG. 3 is a sectional view of an MEMS microphone package containing the MEMS microphone chip of FIG. 2B and a circuit board.

FIG. 3 is a schematic diagram of a microphone package 20 which includes a circuit board 202 and the described MEMS microphone chip 200. The MEMS microphone chip 200 is mounted on the circuit board 202, wherein the side walls 208 and the bumping balls 209 and 209' (shown in FIG. 2A) contact the circuit board 202.

The circuit board 202 and the substrate 207 of the MEMS microphone chip 200 are spaced apart by the side walls 208. Thus, a back chamber 201 is formed by the side walls 208, the circuit board 202, and the substrate 207. Note that a larger back chamber 201 is preferred. As described, the rigid back plate 2032 is perforated. This arrangement facilitates vibration of the flexible diaphragm 2031 by forcing air between the flexible diaphragm 2031 and the rigid back plate 2032 into and out of the back chamber 201. If the volume of the back chamber 201 is too small, then there may be some difficulty by the flexible diaphragm 2031 to produce sound pressure vibrations, thus making the sensitivity of the MEMS microphone chip 200 poor.

There should be a complete connection of the side walls 208 to the circuit board 202 and the substrate 20 to avoid any acoustic leakage into the back chamber 201. This ensures that the MEMS microphone chip 200 can only receive sound through the sound inlet 2072. On the other hand, if there is a gap through which sound enters the back chamber 201, then the flexible diaphragm 2031 will suffer from opposing sound pressures, one from the sound inlet 2072 and the other from the back chamber 201. Under such a circumstance, the vibration of the flexible diaphragm 2031 will be constrained, and the sensitivity of the MEMS microphone chip 200 will be lowered.

The side walls 208 and the circuit board 202 are electrically connected to the grounded contact 2071 through the bumping ball 209'. Thus, the side walls 208, the circuit board 202, and the substrate 207 constitute a means for shielding (also named Faraday cage) which is electrically connected to the ground (or a constant voltage), thus protecting the MEMS microphone transducer 203 from radio frequency (RF) interference.

Figure 4:
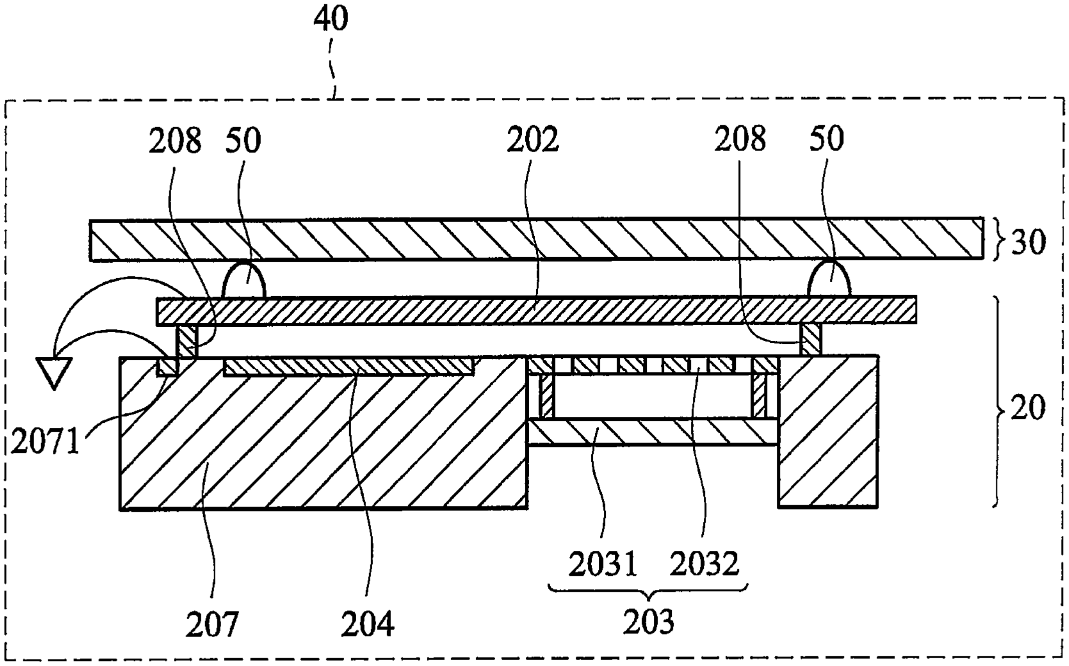
FIG. 4 is a sectional view of an electronic device containing the MEMS microphone package of FIG. 3 and a system board.

FIG. 4 is a schematic diagram of an electronic device 40 which includes a system board 30 and the described microphone package 20. The circuit board 202 of the microphone package 20 is electrically connected to the system board 30 through a plurality of bumping balls 50. The system board 30 handles various signal of the electronic device 40, including the sound signal from the microphone package 20.

Figure 5:
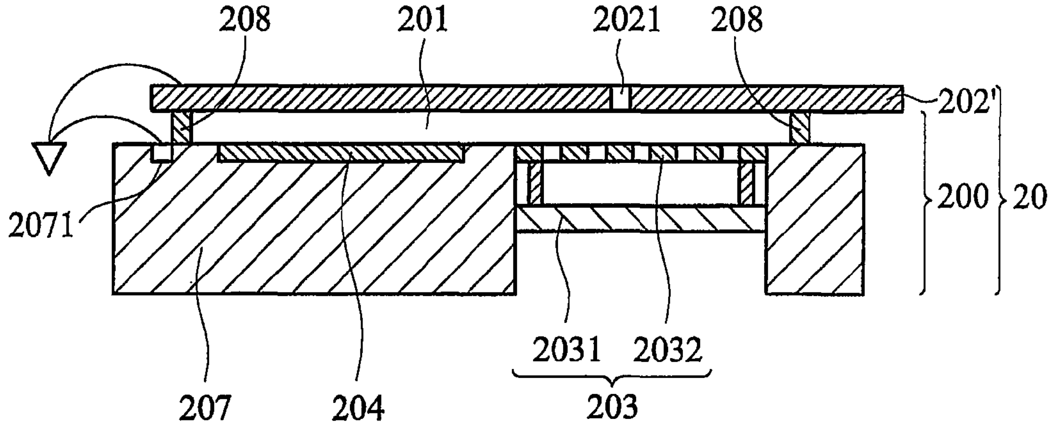
FIG. 5 is a sectional view of an MEMS microphone package containing another MEMS microphone chip and a circuit board.

For some applications of the electronic device 40, the circuit board 202 is provided with a small through hole allowing air leakage into the back chamber 201. FIG. 5 depicts a microphone package 20' of such an application, wherein the same reference numerals are used for elements which are identical or similar to those shown in FIG. 3. A small through hole 2021 is provided on the circuit board 202' to balance the air pressure between the back chamber and the atmosphere. Thus, the air leakage is very small, to avoid degrading the sensitivity of the MEMS microphone chip 200 in the range of 20 Hz-20 kHz (the audible sound).

Figure 6:
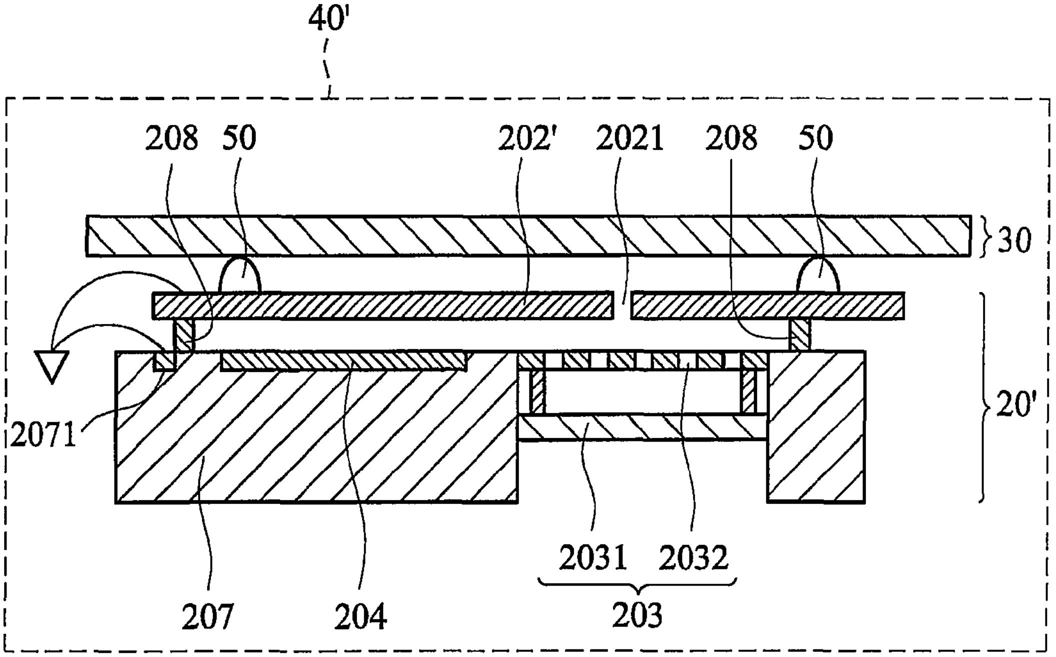
FIG. 6 is a sectional view of an electronic device containing the MEMS microphone package of FIG. 5 and a system board.

FIG. 6 depicts an electronic device 40' provided with the microphone package 20' of FIG. 5, wherein the microphone package 20' is electrically connected to a system board 30 through a plurality of bumping balls 50. The system board 30 handles various signal of the electronic device 40', including the sound signal from the microphone package 20'.

It is understood that the invention is equally applicable to a variety of electronic devices including cellular phones, personal digital assistants (PDAs), global positioning system (GPS) receivers, and others.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A micro-electro-mechanical-system microphone chip, comprising:

a substrate;

a micro-electro-mechanical-system transducer formed on the substrate, generating a sound signal according to sound pressure variations; and a readout circuit also formed on the substrate, reading the sound signal from the micro-electro-mechanical-system transducer, wherein the micro-electro-mechanical-system transducer comprises a flexible diaphragm vibrating according to sound pressure variations and a rigid back plate spaced apart from the flexible diaphragm, wherein the back plate of the micro-electro-mechanical-system transducer is perforated and is grounded.

2. The micro-electro-mechanical-system microphone chip as claimed in claim 1, wherein the readout circuit is a complementary metal-oxide semiconductor circuit.

3. The micro-electro-mechanical-system microphone chip as claimed in claim 1, further comprising a plurality of side walls encircling the micro-electro-mechanical-system transducer and the readout circuit on the substrate.

4. The micro-electro-mechanical-system microphone chip as claimed in claim 1, further comprising a bumping ball formed on the substrate and electrically connected to the readout circuit.

5. The micro-electro-mechanical-system microphone chip as claimed in claim 1, further comprising a bumping ball formed on the substrate and electrically connected to a constant voltage through the substrate.

6. A microphone package, comprising:

a circuit board; and a micro-electro-mechanical-system microphone chip, mounted on the circuit board, comprising a substrate, a micro-electro-mechanical-system transducer formed on the substrate, and a readout circuit also formed on the substrate, wherein the micro-electro-mechanical-system transducer generates a sound signal according to sound pressure variations, and the readout circuit reads the sound signal from the micro-electro-mechanical-system transducer, wherein the micro-electro-mechanical-system microphone chip further comprises a plurality of side walls, and wherein the side walls, the circuit board, and the substrate are electrically connected to a constant voltage so as to form a means for shielding, thus protecting the micro-electro-mechanical-system transducer from radio frequency interference.

7. The microphone package as claimed in claim 6, wherein the micro-electro-mechanical-system transducer comprises a flexible diaphragm vibrating according to sound pressure variations, and a rigid back plate spaced apart from the flexible diaphragm.

8. The microphone package as claimed in claim 7, wherein the back plate of the micro-electro-mechanical-system transducer is perforated.

9. The microphone package as claimed in claim 6, wherein the readout circuit is a complementary metal-oxide semiconductor circuit.

10. The microphone package as claimed in claim 6, wherein the sidewalls encircle the micro-electro-mechanical-system transducer and the readout circuit on the substrate, and separating the circuit board from the substrate.

11. The microphone package as claimed in claim 10, wherein a back chamber is formed by the side walls, the circuit board, and the substrate, and the circuit board has a through hole connected to an interior of the back chamber.

12. The microphone package as claimed in claim 10, wherein the substrate has a contact electrically connected to the constant voltage, and the micro-electro-mechanical-system microphone chip further comprises a bumping ball formed on the substrate and electrically connected to the contact as well as the circuit board.

13. The microphone package as claimed in claim 6, wherein the micro-electro-mechanical-system microphone chip further comprises a bumping ball formed on the substrate and electrically connected between the readout circuit and the circuit board.

14. An electronic device, comprising:

a circuit board;

a system board electrically connected to the circuit board; and a micro-electro-mechanical-system microphone chip, mounted on the circuit board, comprising a substrate, a micro-electro-mechanical-system transducer formed on the substrate, and a readout circuit also formed on the substrate, wherein the micro-electro-mechanical-system transducer generates a sound signal according to sound pressure variations, and the readout circuit reads the sound signal from the micro-electro-mechanical-system transducer, wherein the micro-electro-mechanical-system transducer comprises a flexible diaphragm vibrating according to sound pressure variations and a rigid back plate spaced apart from the flexible diaphragm, wherein the rigid back plate is grounded.

15. The electronic device as claimed in claim 14, wherein the back plate of the micro-electro-mechanical-system transducer is perforated.

16. The electronic device as claimed in claim 14, wherein the readout circuit is a complementary metal-oxide semiconductor circuit.

17. The electronic device as claimed in claim 14, wherein the micro-electro-mechanical-system microphone chip further comprises a plurality of side walls encircling the micro-electro-mechanical-system transducer and the readout circuit on the substrate, and separating the circuit board from the substrate.

18. The electronic device as claimed in claim 17, wherein a back chamber is formed by the side walls, the circuit board, and the substrate, and the circuit board has a through hole connected to an interior of the back chamber.

19. The electronic device as claimed in claim 17, wherein the side walls, the circuit board, and the substrate are electrically connected to a constant voltage so as to form a means for shielding, thus protecting the micro-electro-mechanical-system transducer from radio frequency interference.

20. The electronic device as claimed in claim 19, wherein the substrate has a contact electrically connected to the constant voltage, and the micro-electro-mechanical-system microphone chip further comprises a bumping ball formed on the substrate and electrically connected to the contact as well as the circuit board.

21. The electronic device as claimed in claim 14, wherein the micro-electro-mechanical-system microphone chip further comprises a bumping ball formed on the substrate and electrically connected between the readout circuit and the circuit board.

* * * * *